US009362912B2

(12) United States Patent
Jung

(10) Patent No.: US 9,362,912 B2
(45) Date of Patent: *Jun. 7, 2016

(54) DATA OUTPUT CIRCUIT OF SEMICONDUCTOR APPARATUS

(71) Applicant: SK hynix Inc., Icheon-si Gyeonggi-do (KR)

(72) Inventor: Hae Kang Jung, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/737,916

(22) Filed: Jun. 12, 2015

(65) Prior Publication Data

US 2015/0280713 A1    Oct. 1, 2015

Related U.S. Application Data

(63) Continuation-in-part of application No. 14/323,238, filed on Jul. 3, 2014.

(30) Foreign Application Priority Data

Mar. 25, 2014    (KR) .................. 10-2014-0034651

(51) Int. Cl.
*H03K 19/003* (2006.01)
*H03K 17/16* (2006.01)
*H03K 19/00* (2006.01)

(52) U.S. Cl.
CPC .......... *H03K 19/00361* (2013.01); *H03K 17/16* (2013.01); *H03K 17/161* (2013.01); *H03K 19/0005* (2013.01); *H03K 19/0008* (2013.01); *H03K 19/00315* (2013.01)

(58) Field of Classification Search
CPC ............. G11C 7/1057; G11C 11/4093; H03K 19/0005; H03K 19/0008; H03K 19/00315; H03K 19/00361; H03K 19/018521; H03K 19/215; H03K 5/01; H03K 17/16; H03K 17/161

See application file for complete search history.

(56) References Cited

U.S. PATENT DOCUMENTS

| | | | | |
|---|---|---|---|---|
| 5,606,275 A * | 2/1997 | Farhang | ............. | H03K 19/0005 327/108 |
| 8,766,664 B2 * | 7/2014 | Yokou | ..................... | G11C 5/147 326/30 |
| 8,791,722 B2 * | 7/2014 | Lee | ................... | H03K 19/00315 326/87 |
| 2009/0279369 A1 * | 11/2009 | Song | ..................... | G11C 7/1051 365/189.15 |
| 2010/0164544 A1 | 7/2010 | Song | | |
| 2013/0088258 A1 * | 4/2013 | Yokou | ..................... | G11C 5/147 326/30 |
| 2013/0169311 A1 | 7/2013 | Monga | | |
| 2015/0115999 A1 | 4/2015 | Lee | | |

FOREIGN PATENT DOCUMENTS

KR    100930414 B1    11/2009

* cited by examiner

*Primary Examiner* — Vibol Tan
(74) *Attorney, Agent, or Firm* — Wiliam Park & Associates Ltd.

(57) ABSTRACT

A data output circuit of a semiconductor apparatus includes a pull-up driver electrically coupled between a power supply terminal and an output terminal, and configured to drive the output terminal in response to pull-up control signals. The data output circuit may also include a pull-down driver electrically coupled between the output terminal and a ground terminal, and configured to drive the output terminal in response to pull-down control signals. Further, the data output circuit may include a compensation unit configured to open a current path between the output terminal and the ground terminal during an operation period of the pull-up driver, and allow leakage current of the pull-up driver to flow through the current path.

23 Claims, 4 Drawing Sheets

DATA OUTPUT CIRCUIT OF SEMICONDUCTOR APPARATUS

CROSS-REFERENCES TO RELATED APPLICATION

This application is a continuation-in-part of application Ser. No. 14/323,238, filed Jul. 3, 2014, titled "Data Output Circuit of a Semiconductor Apparatus" and claims priority under 35 U.S.C. 119(a) to Korean application number 10-2014-0034651, filed on Mar. 25, 2014, in the Korean Intellectual Property Office, which is incorporated herein by reference in its entirety as set forth in full.

BACKGROUND

1. Technical Field

Various embodiments relate to a semiconductor apparatus, and more particularly, to a data output circuit of a semiconductor apparatus.

2. Related Art

In a semiconductor apparatus, it is important to constantly retain the level of an output voltage (VOH), so as to ensure stable data communication between the semiconductor apparatus and an external system coupled with the semiconductor apparatus, for example, a memory controller.

The output voltage (VOH) may be the voltage level of an output terminal when outputting high level data.

SUMMARY

In an embodiment, a data output circuit of a semiconductor apparatus may include a pull-up driver electrically coupled between a power supply terminal and an output terminal, and configured to drive the output terminal in response to pull-up control signals. The data output circuit may also include a pull-down driver electrically coupled between the output terminal and a ground terminal, and configured to drive the output terminal in response to pull-down control signals. Further, the data output circuit may include a compensation unit configured to open a current path between the output terminal and the ground terminal during an operation period of the pull-up driver, and allow leakage current of the pull-up driver to flow through the current path.

In an embodiment, a data output circuit of a semiconductor apparatus may include a pull-up driver electrically coupled between a power supply terminal and an output terminal, and configured to drive the output terminal in response to pull-up control signals. The data output circuit may also include a pull-down driver electrically coupled between the output terminal and a ground terminal, and configured to drive the output terminal in response to pull-down control signals. Further, the data output circuit may also include a compensation unit configured to open a current path from the output terminal to the ground terminal in response to compensation codes, and control a current amount of the current path.

In an embodiment, a data output circuit of a semiconductor apparatus may include a pull-up driver electrically coupled between a power supply terminal and an output terminal and configured to drive the output terminal in response to a pull-up control signal generated according to a level of an output data. The data output circuit may also include a pull-down driver electrically coupled between the output terminal and a ground terminal and configured to drive the output terminal in response to a pull-down control signal generated according to the level of the output data. Further, the data output circuit may include a compensation unit electrically coupled between the output terminal and the ground terminal and configured to open a current path between the output terminal and the ground terminal in response to the pull-up control signal.

DETAILED DESCRIPTION

A data output circuit of a semiconductor apparatus according to the invention will be described below with reference to the accompanying figures through various embodiments. As an output voltage level variation VOH variation may occur due to a leakage current of a transistor, a problem may be caused in that the level of the output voltage VOH is likely to be raised over a target level.

Figure 1:
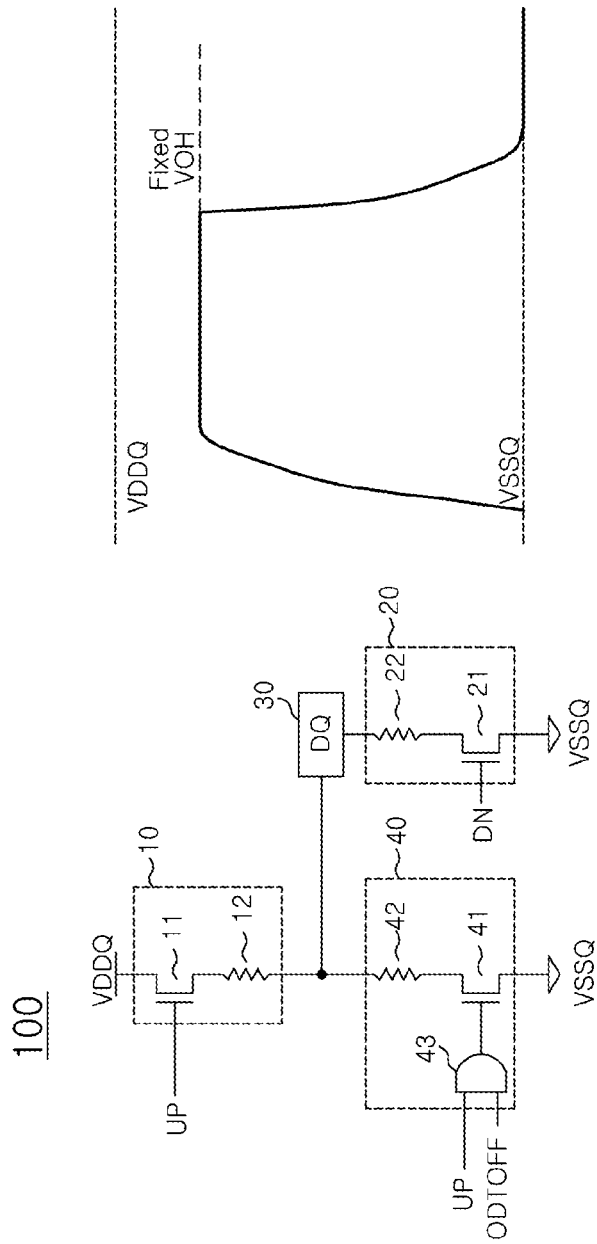
FIG. 1 is a circuit diagram of a data output circuit of a semiconductor apparatus in accordance with an embodiment of the invention.

Referring to FIG. 1, a data output circuit 100 of a semiconductor apparatus in accordance with an embodiment of the invention may include a pull-up driver 10, a pull-down driver 20, and a compensation unit 40.

It may be defined that the semiconductor apparatus operates in a termination mode in the case where the resistor of an external system, for example, a memory controller, is electrically coupled with an output terminal (DQ) 30 and operates in a no-termination mode in the case where the electrical coupling with the resistor of the external system is blocked.

As the semiconductor apparatus operates in the no-termination mode, an on-die termination off signal ODTOFF may be activated to a high level.

The on-die termination off signal ODTOFF may be set in a mode register set (MRS).

The pull-up driver 10 may be electrically coupled between a power supply terminal VDDQ and the output terminal 30, and may include a transistor 11 and a resistor 12.

The pull-down driver 20 may be electrically coupled between the output terminal 30 and a ground terminal VSSQ, and may include a transistor 21 and a resistor 22.

The transistors 11 and 21 may then be configured in an NMOS type.

The pull-up driver 10 and the pull-down driver 20 may be configured to drive the output terminal 30 to a logic high level or a logic low level in response to a pull-up control signal UP and a pull-down control signal DN. The pull-up control signal UP and the pull-down control signal DN may be are generated according to the level of output data.

The compensation unit 40 may be configured to open a current path between the output terminal 30 and the ground terminal VSSQ. The current path may be opened during the pull-up period of the pull-up driver 10.

The compensation unit 40 may be configured to open the current path between the output terminal 30 and the ground terminal VSSQ in response to the pull-up control signal UP. Moreover, the compensation unit 40 may be configured to open the current path as a way of having the same operation period as the pull-up driver 10.

The compensation unit 40 may be configured to open the current path between the output terminal 30 and the ground terminal VSSQ in response to the pull-up control signal UP in the no-termination mode, that is, in the case where the on-die termination off signal ODTOFF is activated (to the high level).

The compensation unit 40 may include a transistor 41 and a resistor 42 which are electrically coupled between the output terminal 30 and the ground terminal VSSQ in parallel with the pull-down driver 20, and a logic gate 43 which is configured to AND or perform an AND logic function on the pull-up control signal UP and the on-die termination off signal ODTOFF and apply a resultant signal to the gate of the transistor 41.

The compensation unit 40 may be configured to operate after the substantial turn-off of the transistor 11 in the state wherein the pull-up control signal UP is a high level. The substantial turn-off of the transistor 11 may be implemented when the gate-source voltage (Vgs) of the transistor 11 becomes lower than the threshold voltage of the transistor 11.

The transistor 41 may be configured in an NMOS type.

As the transistor 41 is to drive an amount of current corresponding to the leakage current of the transistor 11 of the pull-up driver 10, a transistor having a relatively smaller current drivability in comparison to the transistor 11 may be used as the transistor 41.

The compensation unit 40 may open the current path extending from the output terminal 30 to the ground terminal VSSQ, in response to the pull-up control signal UP. The compensation unit 40 may perform may open the current path while the pull-up driver 10 performs a driving operation for the output terminal 30 in response to the pull-up control signal UP.

According to the operation of the pull-up driver 10, the same amount of current as the leakage current flowing from the power supply terminal VDDQ to the output terminal 30 may flow from the output terminal 30 through the compensation unit 40 to the ground terminal VSSQ.

Consequently, since the leakage current of the pull-up driver 10 is offset by the compensation unit 40, the level of an output voltage VOH applied to the output terminal 30 may be constantly retained at a target level.

Meanwhile, the operation of the compensation unit 40 may be interrupted regardless of the pull-up control signal UP in the termination mode, that is, in the case where the on-die termination off signal ODTOFF is deactivated (to a low level).

Figure 2:
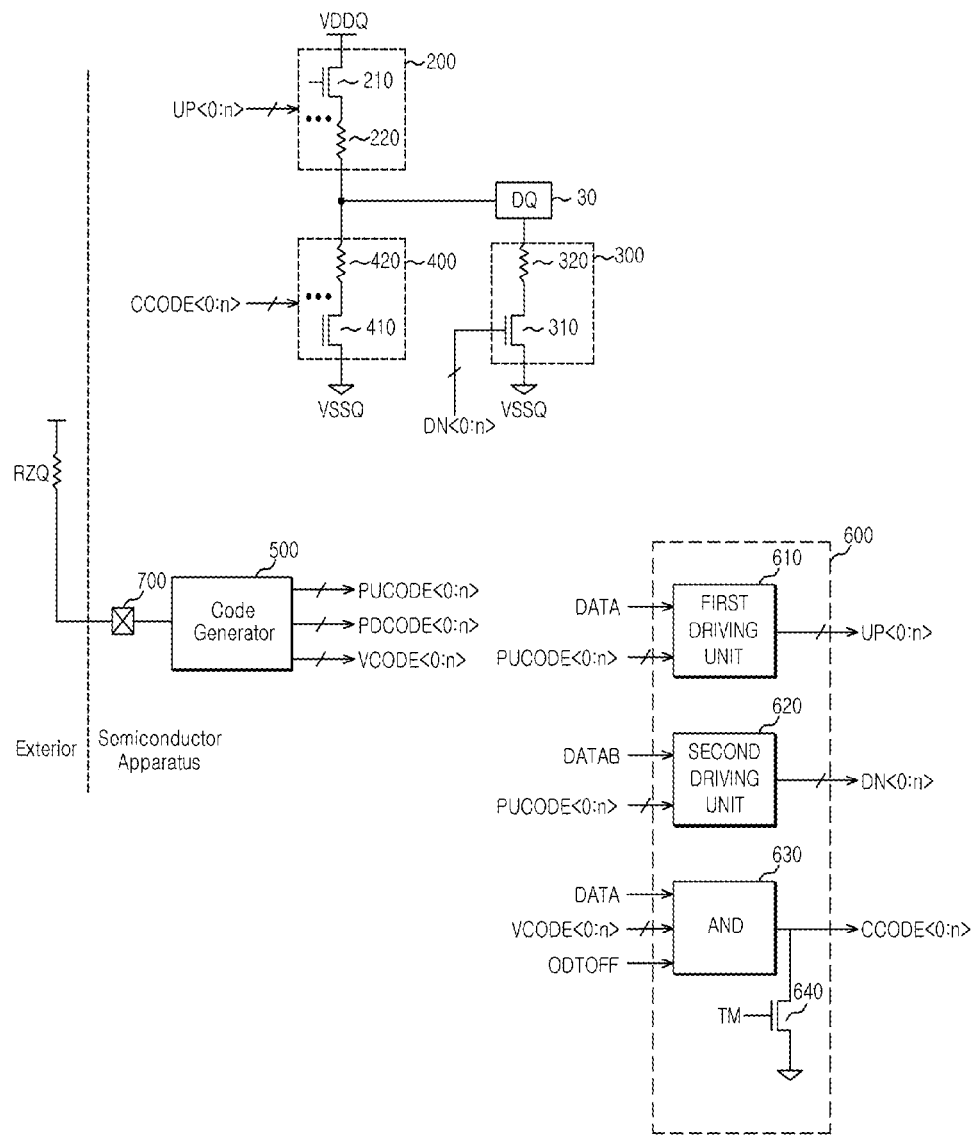
FIG. 2 is a block diagram of a data output circuit of a semiconductor apparatus in accordance with an embodiment of the invention.

Referring to FIG. 2, a data output circuit 101 of a semiconductor apparatus in accordance with an embodiment may include a pull-up driver 200, a pull-down driver 300, a compensation unit 400, a code generator 500, and a pre-driver 600.

The pull-up driver 200 may be electrically coupled between a power supply terminal VDDQ and an output terminal (DQ) 30. In addition, the pull-up driver 200 may include a plurality of pull-up driving units each of which are constituted by a transistor 210 and a resistor 220.

The pull-up driver 200 may be configured to drive the output terminal 30 with a variable impedance in response to pull-up control signals UP<0:n>.

The pull-up driver 200 may be changed in the impedance as the plurality of pull-up driving units are selectively activated according to the values of the pull-up control signals UP<0:n>.

The pull-down driver 300 may be electrically coupled between the output terminal 30 and a ground terminal VSSQ, and may include a plurality of pull-down driving units each of which is constituted by a transistor 310 and a resistor 320.

The pull-down driver 300 may be configured to drive the output terminal 30 with a variable impedance in response to pull-down control signals DN<0:n>.

The pull-down driver 300 may be changed in the impedance as the plurality of pull-down driving units are selectively activated according to the values of the pull-down control signals DN<0:n>.

The transistors 210 and 310 may be configured in an NMOS type.

The compensation unit 400 may be configured to open a current path extending from the output terminal 30 to the ground terminal VSSQ in response to compensation codes CCODE<0:n>. The compensation unit 400 may also control the current amount of the current path.

The compensation unit 400 may be electrically coupled between the output terminal 30 and the ground terminal VSSQ in parallel with the pull-down driver 300. In addition, the compensation unit 400 may include a plurality of compensation units each of which are constituted by a transistor 410 and a resistor 420.

The transistor 410 may be configured in an NMOS type.

As the transistor 410 is to drive an amount of current corresponding to the leakage current of the transistor 210 of the pull-up driver 200, a transistor having a relatively smaller current drivability in comparison to the transistor 210 may be used as the transistor 410.

The code generator 500 may be electrically coupled with an external resistor RZQ through an external resistor coupling terminal 700.

The code generator 500 may be configured to generate pull-up driver impedance control codes (hereinafter, referred to as "pull-up codes") PUCODE<0:n>, pull-down driver impedance control codes (hereinafter, referred to as "pull-down codes") PDCODE<0:n> and pre-codes VCODE<0:n>. The code generator 500 may generate the pull-up codes PUCODE<0:n>, the pull-down codes PDCODE<0:n> and the pre-codes VCODE<0:n> based on the resistance value of the external resistor RZQ.

The pre-driver 600 may be configured to generate the pull-up control signals UP<0:n>, the pull-down control signals DN<0:n> and the compensation codes CCODE<0:n> in response to data signals DATA/DATAB, the pull-up codes PUCODE<0:n>, the pull-down codes PDCODE<0:n>, the pre-codes VCODE<0:n> and a test mode signal TM.

The pre-driver 600 may include a first driving unit 610, a second driving unit 620, an AND logic (AND) 630, and a transistor 640.

The data signal DATA and the data signal DATAB may have opposite logic levels.

The first driving unit 610 may be configured to generate the pull-up codes PUCODE<0:n> as the pull-up control signals UP<0:n> when the data signal DATA is a high level. In addition, the first driving unit 610 may output all the pull-up control signals UP<0:n> to a low level when the data signal DATA is a low level.

The second driving unit 620 may be configured to generate the pull-down codes PDCODE<0:n> as the pull-down control signals DN<0:n> when the data signal DATAB is a high level. In addition, the second driving unit 620 may output all the pull-down control signals DN<0:n> to a low level when the data signal DATAB is a low level.

The AND logic 630 may output the pre-codes VCODE<0:n> as the compensation codes CCODE<0:n> when the on-die termination off signal ODTOFF is the high level and the data signal DATA is a high level.

The AND logic 630 may output all bits of the compensation codes CCODE<0:n> to a low level regardless of the data signal DATA, in the termination mode, that is, in the case where the on-die termination off signal ODTOFF is the low level.

The transistor 640 may deactivate the compensation codes CCODE<0:n> by outputting all the bits of the compensation codes CCODE<0:n> to the low level when the test mode signal TM is activated.

If all the compensation codes CCODE<0:n> are outputted to the low level, all the transistors 420 of the compensation unit 400 are turned off and interrupted in their operations.

Figure 3:
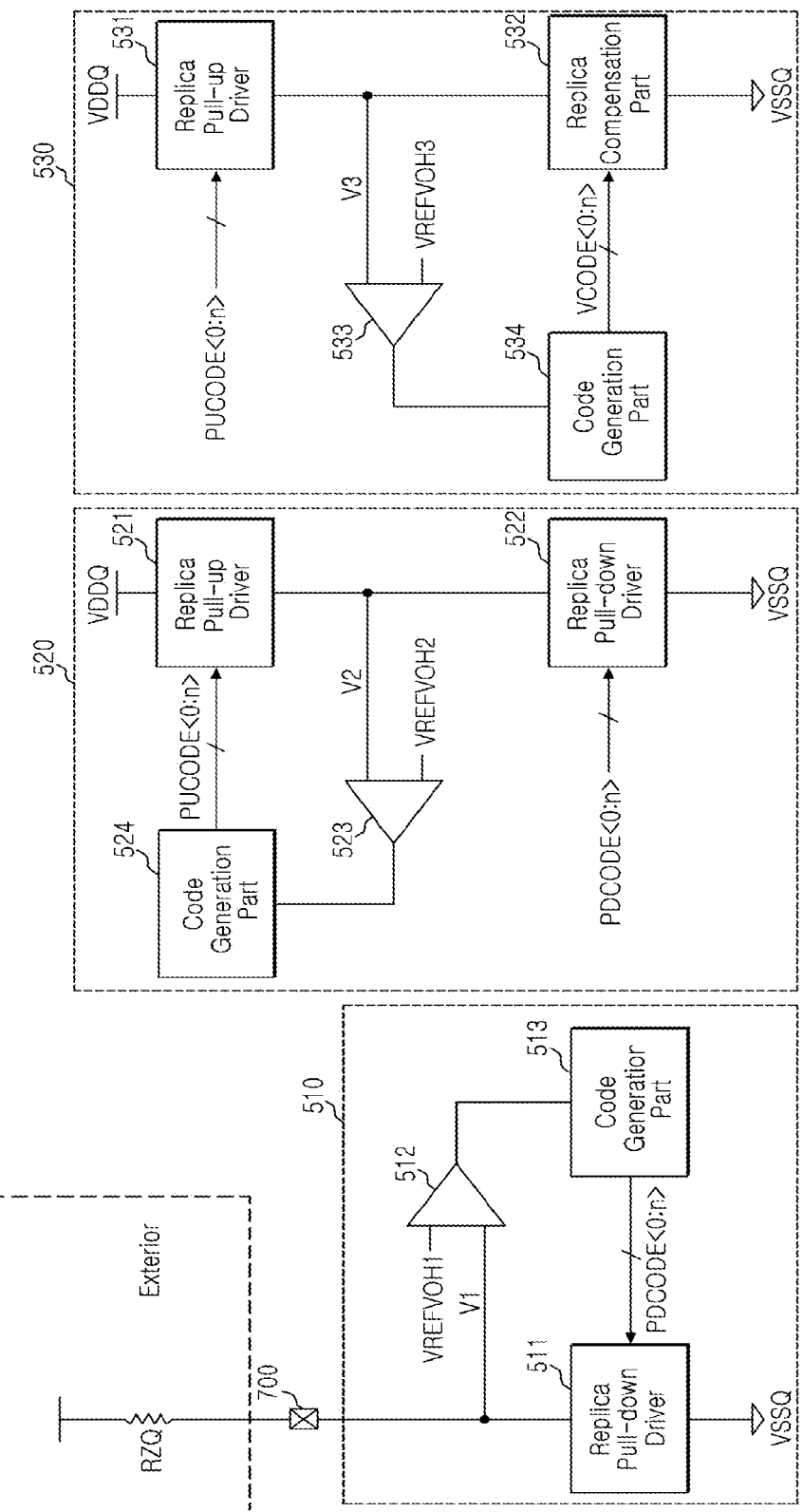
FIG. 3 is a block diagram showing the internal configuration of the code generator shown in FIG. 2.

The test mode signal TM may be used as a signal to interrupt the function of the compensation unit 400. The function of the compensation unit 400 may be interrupted by activating the test mode signal TM as described above. FIG. 3 also illustrates an exterior of a semiconductor apparatus.

Referring to FIG. 3, the code generator 500 is configured to include a first code generating section 510, a second code generating section 520, and a third code generating section 530.

The first code generating section 510 may be configured to compare a first replica voltage V1 acquired by replicating the output voltage of the pull-down driver 300 and a first reference voltage VREFVOH1. In addition, the first code generation section 510 may generate the pull-down codes PDCODE<0:n>.

The first code generating section 510 may be configured to include a replica pull-down driver 511, a comparator 512, and a code generation part 513.

The replica pull-down driver 511 is a circuit configured by replicating the pull-down driver 300.

The replica pull-down driver 511 may be electrically coupled between the external resistor coupling terminal 700 and the ground terminal VSSQ.

The external resistor RZQ of the external system may be electrically coupled to the external resistor coupling terminal 700.

The replica pull-down driver 511 is variable in the impedance according to the pull-down codes PDCODE<0:n>. The replica pull-down driver also controls the level of the first replica voltage V1 according to the changeable impedance.

The comparator 512 may be configured to compare the first replica voltage V1 and the first reference voltage VREFVOH1 and output a comparison result.

The first reference voltage VREFVOH1 may be a value proportional to the voltage level of the power supply terminal VDDQ. The voltage level of the power supply terminal VDDQ may be for example, VDDQ/2, VDDQ/3 or the like.

The code generation part 513 may be configured to control the values of the pull-down codes PDCODE<0:n> in response to the output of the comparator 512.

A first impedance control operation, more specifically, the linked operation of the replica pull-down driver 511, the comparator 512 and the code generation part 513 is ended when the first replica voltage V1 and the first reference voltage VREFVOH1 have substantially the same value.

The second code generating section 520 may be configured to compare a second replica voltage V2 acquired by replicating the voltage of an intermediate node between the pull-down driver 300 and the pull-up driver 200 and a second reference voltage VREFVOH2. The second code generating section may generate the pull-up codes PUCODE<0:n>.

The second code generating section 520 may be configured to include a replica pull-up driver 521, a replica pull-down driver 522, a comparator 523, and a code generation part 524.

The replica pull-up driver 521 is a circuit configured by replicating the pull-up driver 200.

The replica pull-down driver 522 is a circuit configured by replicating the pull-down driver 300.

The replica pull-up driver 521 and the replica pull-down driver 522 may be electrically coupled between the power supply terminal VDDQ and the ground terminal VSSQ.

The replica pull-down driver 522 is in the state wherein the impedance control is completed by the first impedance control operation. As a result, the values of the pull-down codes PDCODE<0:n> are fixed.

The replica pull-up driver 521 is variable in the impedance according to the pull-up codes PUCODE<0:n>. The replica pull-up driver 521 also controls the level of the second replica voltage V2 by a linked operation with the replica pull-down driver 522.

The comparator 523 may be configured to compare the second replica voltage V2 and the second reference voltage VREFVOH2 and output a comparison result.

The second reference voltage VREFVOH2 may be a value proportional to the voltage level of the power supply terminal VDDQ. The voltage level of the power supply terminal VDDQ may be for example, VDDQ/2, VDDQ/3 or the like.

The code generation part 524 may be configured to control the values of the pull-up codes PUCODE<0:n> in response to the output of the comparator 523.

A second impedance control operation, more specifically, the linked operation of the replica pull-up driver 521, the replica pull-down driver 522, the comparator 523 and the code generation part 524 is ended when the second replica voltage V2 and the second reference voltage VREFVOH2 have substantially the same value.

The third code generating section 530 may be configured to generate the pre-codes VCODE<0:n> by comparing a third replica voltage V3 acquired by replicating the voltage of an intermediate node between the pull-up driver 200 and the compensation unit 400 and a third reference voltage VREFVOH3. The third code generating section 530 may also.

The third code generating section 530 may be configured to include a replica pull-up driver 531, a replica compensation part 532, a comparator 533, and a code generation part 534.

The replica pull-up driver 531 is a circuit configured by replicating the pull-up driver 200.

The replica pull-up driver 531 and the replica compensation part 532 may be electrically coupled between the power supply terminal VDDQ and the ground terminal VSSQ.

The replica pull-up driver 531 is in the state wherein the impedance control is completed by the second impedance control operation. Accordingly, the values of the pull-up codes PUCODE<0:n> are fixed.

The replica compensation part 532 is variable in the impedance according to the pre-codes VCODE<0:n>. The replica compensation part 532 may also control the level of the third replica voltage V3 by a linked operation with the replica pull-up driver 531.

The comparator 533 may be configured to compare the third replica voltage V3 and the third reference voltage VREFVOH3 and output a comparison result.

The third reference voltage VREFVOH3 may become the same level as the level of an output voltage VOH set according to the no-termination mode, or more specifically, the case where the resistor of the external system is not electrically coupled to the output terminal 30.

The code generation part 534 may be configured to control the values of the pre-codes VCODE<0:n> in response to the output of the comparator 533.

A third impedance control operation, more specifically, the linked operation of the replica pull-up driver 531, the replica compensation part 532, the comparator 533 and the code generation part 534 is ended when the third replica voltage V3 and the third reference voltage VREFVOH3 have substantially the same value.

The first to third reference voltages VREFVOH1 to VREFVOH3 may have the same value or different values according to an operating condition of the semiconductor apparatus such as the termination mode or as the no-termination mode.

As described above, since the third impedance control operation is performed with the pull-up codes PUCODE<0:n> fixed, the impedance of the replica compensation part 532 may be changed according to the third reference voltage VREFVOH3.

The replica compensation part 532 and the replica pull-up driver 531 are circuits configured by replicating the compensation unit 400 and the pull-up driver 200.

The pull-up codes PUCODE<0:n>, the pull-down codes PDCODE<0:n> and the pre-codes VCODE<0:n>, which have been completely controlled through the first to third impedance control operations, are also provided to the pull-up driver 200, the pull-down driver 300 and the compensation unit 400, respectively.

Where it is necessary due to a variation in an external or internal operating condition or a design change to control the level of the output voltage VOH of the output terminal 30, the third reference voltage VREFVOH3 may be controlled in conformity with a changed amount of the level of the output voltage VOH.

If the third reference voltage VREFVOH3 is controlled, the values of the pre-codes VCODE<0:n> are controlled through the third impedance control operation.

Accordingly, an amount of current flowing through the compensation unit 400 is controlled in conformity with a change in the level of the output voltage VOH.

As a result, since the compensation unit 400 controls an amount of current flowing from the output terminal 30 to the ground terminal VSSQ to conform to a variation in the level of the output voltage VOH, the level of the output voltage VOH may be constantly retained at a target level as a result. Even though the target level of the output voltage VOH is changed, the corresponding level may nevertheless be constantly retained.

Figure 4:
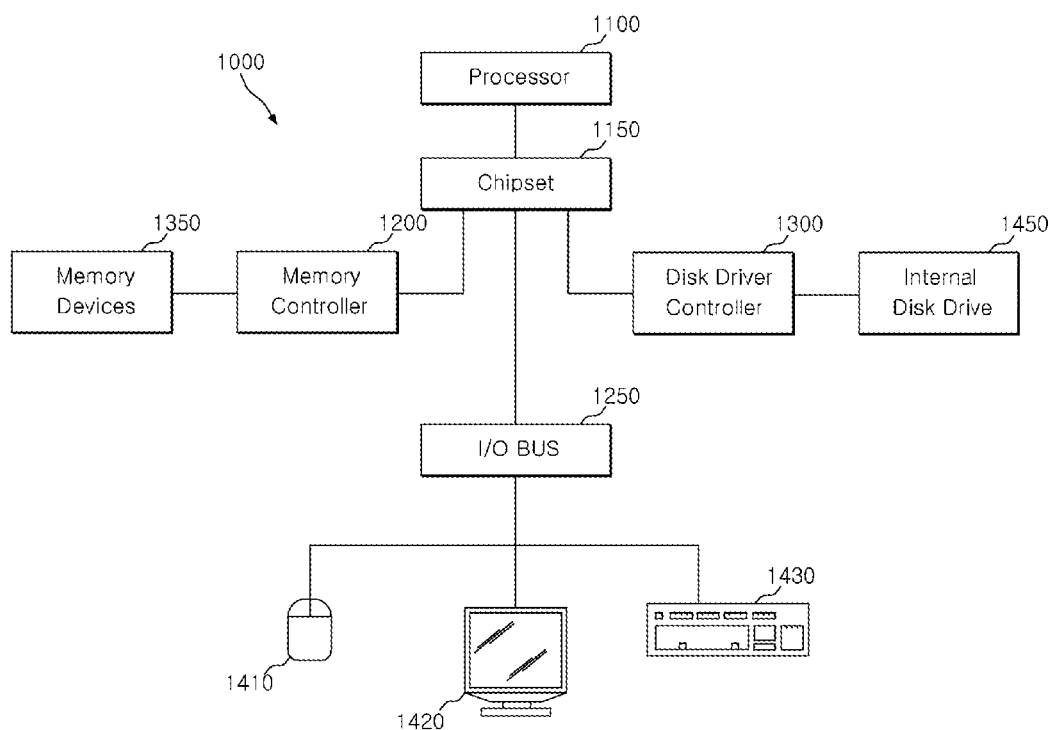
FIG. 4 illustrates a block diagram of a system employing a memory controller circuit in accordance with an embodiment of the invention.

Referring to FIG. 4, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the data output circuit 100 of the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. Further, the disk drive controller 1300 and the internal disk drives 1450 may communicate with each other or with the chipset 1150 using virtually any type of communication protocol, including all of those mentioned with regard to the I/O bus 1250.

While certain embodiments have been described above, it will be understood to those skilled in the art that the embodiments described are by way of example only. Accordingly, the data output circuit of a semiconductor apparatus described should not be limited based on the described embodiments. Rather, the data output circuit of a semiconductor apparatus described should only be limited in light of the claims that follow when taken in conjunction with the above description and accompanying figures.

What is claimed is:

1. A data output circuit of a semiconductor apparatus, comprising:
   a pull-up driver coupled between a power supply terminal and an output terminal, and configured to drive the output terminal in response to pull-up control signals;
   a pull-down driver coupled between the output terminal and a ground terminal, and configured to drive the output terminal in response to pull-down control signals; and
   a compensation unit configured to open a current path between the output terminal and the ground terminal according to the pull-up control signals and an on-die termination off signal which defines a no-termination mode, during an operation period of the pull-up driver, and allow leakage current of the pull-up driver to flow through the current path.

2. The data output circuit according to claim 1, wherein the pull-up driver comprises:
   an NMOS type transistor and a resistor.

3. The data output circuit according to claim 2, wherein the pull-down driver comprises:
   a resistor and an NMOS type transistor.

4. The data output circuit according to claim 2, wherein the compensation unit is coupled between the output terminal and the ground terminal, in parallel with the pull-down driver, and comprises a resistor and an NMOS type transistor.

5. The data output circuit according to claim 4, wherein the transistor of the compensation unit is designed to have a relatively smaller current drivability in relation to the transistor of the pull-up driver.

6. A data output circuit of a semiconductor apparatus, comprising:
   a pull-up driver coupled between a power supply terminal and an output terminal, and configured to drive the output terminal in response to pull-up control signals;
   a pull-down driver coupled between the output terminal and a ground terminal, and configured to drive the output terminal in response to pull-down control signals
   a compensation unit configured to open a current path from the output terminal to the ground terminal in response to compensation codes, and control a current amount of the current path;
   a code generator configured to generate pull-up codes, pull-down codes and pre-codes; and a pre-driver configured to generate the pull-up control signals, the pull-down control signals and the compensation codes according to data signals, the pull-up codes, the pull-down codes, the pre-codes.

7. The data output circuit according to claim 6, wherein the pull-up driver comprises:
a plurality of pull-up driving units that each include an NMOS type transistor and a resistor.

8. The data output circuit according to claim 7, wherein the pull-down driver comprises:
a plurality of pull-down driving units that each include a resistor and an NMOS type transistor.

9. The data output circuit according to claim 7, wherein the compensation unit is coupled between the output terminal and the ground terminal in parallel with the pull-down driver, and includes a plurality of compensation units that each include a resistor and an NMOS type transistor.

10. The data output circuit according to claim 9, wherein the transistor of the compensation unit is designed to have a smaller current drivability in comparison to the transistor of the pull-up driver.

11. The data output circuit according to claim 6, wherein the code generator is configured to generate the pre-codes in a state in which a receiver-side resistor of an external system is not coupled with the output terminal.

12. The data output circuit according to claim 6, wherein the code generator comprises:
a first code generating section configured to compare a first replica voltage acquired by replicating an output voltage of the pull-down driver and a first reference voltage, and generate the pull-down codes;
a second code generating section configured to compare a second replica voltage acquired by replicating a voltage of an intermediate node between the pull-down driver and the pull-up driver and a second reference voltage, and generate the pull-up codes; and
a third code generating section configured to compare a third replica voltage acquired by replicating a voltage of an intermediate node between the pull-up driver and the compensation unit and a third reference voltage, and generate the pre-codes.

13. The data output circuit according to claim 12, wherein the first code generating section comprises:
a replica pull-down driver configured by replicating the pull-down driver, and configured to be controlled in an impedance according to the pull-down codes and control a level of the first replica voltage;
a comparator configured to compare the first replica voltage and the first reference voltage and output a comparison result; and
a code generation part configured to control values of the pull-down codes in response to an output of the comparator.

14. The data output circuit according to claim 12, wherein the second code generating section comprises:
a replica pull-down driver configured by replicating the pull-down driver;
a replica pull-up driver configured to be changeable in an impedance according to the pull-up codes, and control a level of the second replica voltage by a linked operation with the replica pull-down driver;
a comparator configured to compare the second replica voltage and the second reference voltage and output a comparison result; and
a code generation part configured to control values of the pull-up codes in response to an output of the comparator.

15. The data output circuit according to claim 12, wherein the third code generating section comprises:
a replica pull-up driver configured by replicating the pull-up driver;
a replica compensation part configured to be changeable in an impedance according to the compensation codes, and control a level of the third replica voltage by a linked operation with the replica pull-up driver;
a comparator configured to compare the third replica voltage and the third reference voltage and output a comparison result; and
a code generation part configured to control values of the pre-codes in response to an output of the comparator.

16. The data output circuit according to claim 15, wherein the third reference voltage is controlled to be equal to a target value of a level of an output voltage of the output terminal according to an output of high level data.

17. The data output circuit according to claim 6, wherein the pre-driver is configured to output the pull-up codes and the pull-down codes as the pull-up control signals and the pull-down control signals, or output the pull-up control signals and the pull-down control signals to a level to turn off the pull-up driver and the pull-down driver according to levels of the data signals.

18. The data output circuit according to claim 17, wherein the pre-driver is configured to bypass the compensation codes or output the compensation codes to a level to turn off the compensation unit in response to a test mode signal.

19. The data output circuit according to claim 1,
wherein the compensation unit is configured to operate after a substantial turn-off of the transistor of the compensation unit in a state in which the pull-up control signal is a high level, and
wherein the substantial turn-off of the transistor is implemented as a gate-source voltage of the transistor becomes lower in comparison to a threshold voltage of the transistor.

20. The data output circuit according to claim 1, wherein the compensation unit is configured to allow a current corresponding to a leakage current of the pull-up driver to flow through the current path.

21. The data output circuit according to claim 6 wherein the pre-driver is configured to generate an on-die termination off signal which defines a no-termination mode.

22. The data output circuit according to claim 21, wherein the pre-driver comprises:
a first driving unit configured to generate the pull-up control signals according to the data signal and the pull-up codes;
a second driving unit configured to generate the pull-down control signals according to the data signal and the pull-down codes; and
an AND logic configured to AND the data signal, the pre-codes and the on-die termination off signal, and generate the compensation codes.

23. The data output circuit according to claim 22, wherein the pre-driver further comprises:
a transistor configured to deactivate the compensation codes according to a test mode signal.

* * * * *